United States Patent
Lin et al.

(10) Patent No.: US 7,102,542 B2
(45) Date of Patent: Sep. 5, 2006

(54) APPARATUS AND METHOD FOR DETERMINING OUTPUT SIGNALS ACCORDING TO PRESSURE AND DEPRESSING TIME

(75) Inventors: Hsien-Ming Lin, Taipei (TW); Chin-Chen Kuo, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 489 days.

(21) Appl. No.: 10/428,924

(22) Filed: May 5, 2003

(65) Prior Publication Data

US 2004/0095261 A1      May 20, 2004

(30) Foreign Application Priority Data

Nov. 15, 2002    (TW) ................ 91133473 A

(51) Int. Cl.
　H03K 17/94　　(2006.01)
　H03M 11/00　　(2006.01)
　G06F 3/00　　(2006.01)
　G09G 5/00　　(2006.01)

(52) U.S. Cl. ................ 341/26; 341/22; 341/23; 340/517; 710/1; 345/169; 345/172

(58) Field of Classification Search ........... 341/23, 341/22, 26; 340/7.22, 3.13, 825, 517; 345/156, 345/172, 16.9; 455/112, 166.1; 710/1
See application file for complete search history.

(56) References Cited

U.S. PATENT DOCUMENTS

| | | | | |
|---|---|---|---|---|
| 4,078,257 A | * | 3/1978 | Bagley | 708/145 |
| 4,349,712 A | * | 9/1982 | Michalski | 200/513 |
| 4,771,139 A | * | 9/1988 | DeSmet | 200/5 A |
| 5,007,008 A | * | 4/1991 | Beers | 708/145 |
| 5,313,027 A | * | 5/1994 | Inoue et al. | 200/5 A |
| 5,418,530 A | * | 5/1995 | Moore et al. | 341/22 |
| 6,455,795 B1 | * | 9/2002 | Murakami et al. | 200/345 |
| 6,498,312 B1 | * | 12/2002 | Villain | 200/510 |
| 6,680,676 B1 | * | 1/2004 | Hayashi et al. | 341/22 |
| 6,727,830 B1 | * | 4/2004 | Lui et al. | 341/20 |
| 6,999,009 B1 | * | 2/2006 | Monney | 341/34 |

* cited by examiner

Primary Examiner—Jeffery Hofsass
Assistant Examiner—Sisay Yacob
(74) Attorney, Agent, or Firm—Birch, Stewart, Kolasch & Birch, LLP

(57) ABSTRACT

An apparatus and a method for determining output signals according to pressure and depressing time mainly includes a timer, a scanner and a keyboard connecting electronically to the timer and the scanner. The keyboard has a plurality of button keys. When in use, the timer is set to zero and stops counting time. Then the scanner scans the keyboard to locate the button key being depressed by an external force. A signal is output depending on the external force. A first signal is output when the external force is small. When the external force is large and the time counted by the timer does not exceed a selected time period, the first signal is output. When the time counted by the timer exceeds the selected time period, a second signal is output. Thus input information may be entered through fewer button keys, and injury that might otherwise occur by using composite keys may be avoided.

10 Claims, 5 Drawing Sheets

APPARATUS AND METHOD FOR DETERMINING OUTPUT SIGNALS ACCORDING TO PRESSURE AND DEPRESSING TIME

This nonprovisional application claims priority under 35 U.S.C. § 119(a) on Patent Application No(s). 091133473 filed in TAIWAN, R.O.C. on Nov. 15, 2002, which is(are) herein incorporated by reference.

FIELD OF THE INVENTION

The invention relates to an apparatus and a method for delivering output signals, and particularly an apparatus and a method for determining output signals according to pressure and depressing time.

BACKGROUND OF THE INVENTION

In recent years the volume of information has grown rapidly. Utilization of electronic instruments has also increased significantly. As a result, personal computers, notebook computers, PDAs, and handsets are frequently used by the general public in their daily lives. For entering data into electronic instruments, keyboards or keypads are the most convenient input devices.

Because the number of the button keys on a keyboard is fixed, if a single key cannot provide the original function set for the key, a composite key is generally used to input information. As most users use their hands to operate the composite key to input, the fingers must be extended to cover a distance of at least two keys (a composite key) simultaneously to depress the keys. When the interval of the two keys is too large, the fingers are overextended. To operate the composite keys to enter information under such a condition for a long period of time can cause injury to the hands.

Nowadays the general public wants their electronic instruments be slim and light to make carrying easier. In order to meet these profile (slim and light) requirements, some functions are sacrificed. For instance, the size of the keyboard and number of the button keys are reduced. As a result, users cannot enter input information into the electronic instruments as fast as desired.

In view of the aforesaid problems, it is necessary to enable users to input information with fewer keys and prevent injury resulting from operating the composite keys.

SUMMARY OF THE INVENTION

The primary object of the invention is to provide an apparatus and a method for determining output signals according to pressure and depressing time to facilitate data entry with fewer button keys and to avoid injury resulting from operating the composite keys.

The apparatus of the invention includes a timer, a scanner and a keyboard. The keyboard is electronically connected to the timer and the scanner, and includes a plurality of button keys. Each button key has a button key structure, a first conductor membrane, a spacing membrane and a second conductor membrane. The first conductor membrane has a first conductor. The spacing membrane has an opening corresponding to the first conductor. The second conductor membrane has a second conductor corresponding to the opening.

When in use, the timer is set to zero and stops counting time. The scanner scans the keyboard to locate the button key that is depressed by external force. Depending on the external force, the button key structure and the first conductor are electronically connected selectively to output a first signal. The button key structure and the first conductor are electronically connected, and the first conductor runs through the opening to connect electronically to the second conductor. When the electronic connection between the first conductor and the second conductor has been confirmed, the timer starts counting time. When the counted time of the timer does not exceed a selected time period, the first signal is output. When the counted time exceeds the selected time period, a second signal is output.

The foregoing, as well as additional objects, features and advantages of the invention will be more readily apparent from the following detailed description, which proceeds with reference to the accompanying drawings.

DESCRIPTION OF THE PREFERRED EMBODIMENTS

The invention aims to provide an apparatus and a method for determining output signals according to pressure and depressing time that is capable of determining output signals under different pressure levels and depressing time periods.

Figure 1:
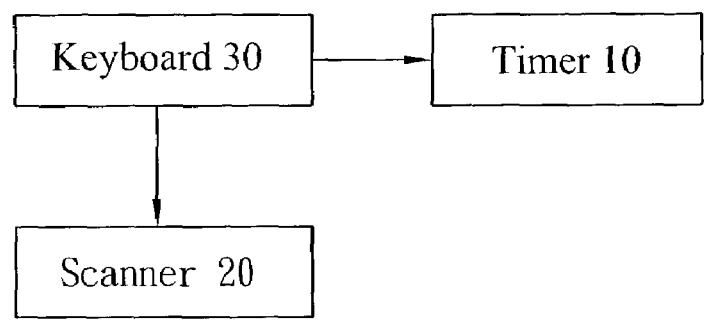
FIG. 1 is a structural block diagram of the invention.
Figure 2:
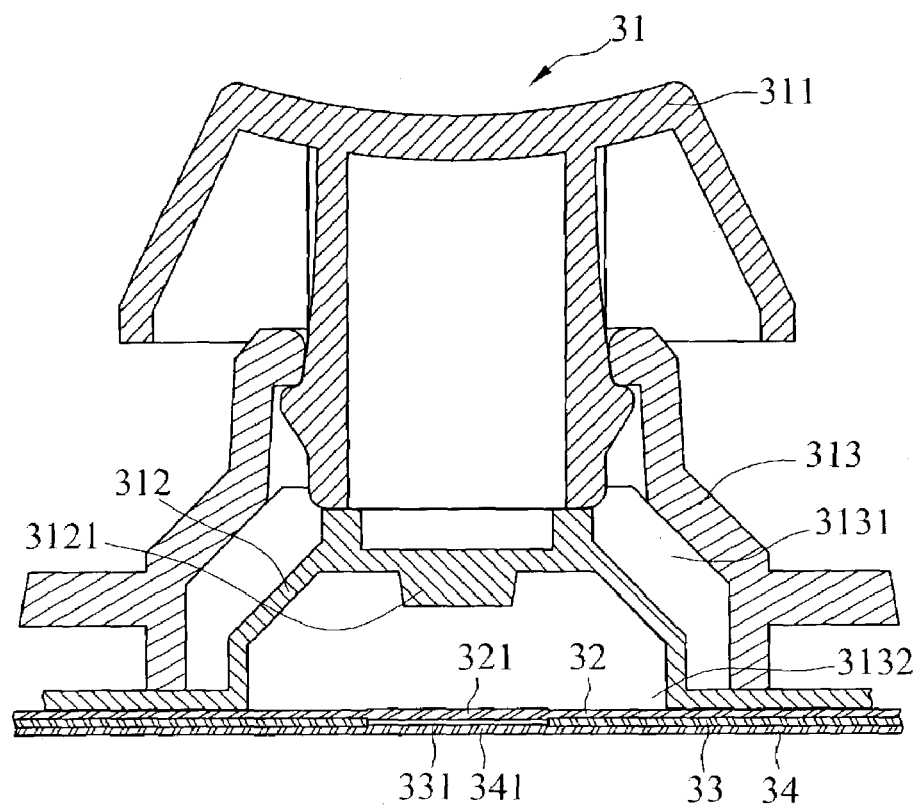
FIG. 2 is a schematic view of the button key structure of the invention.
Figure 3A:
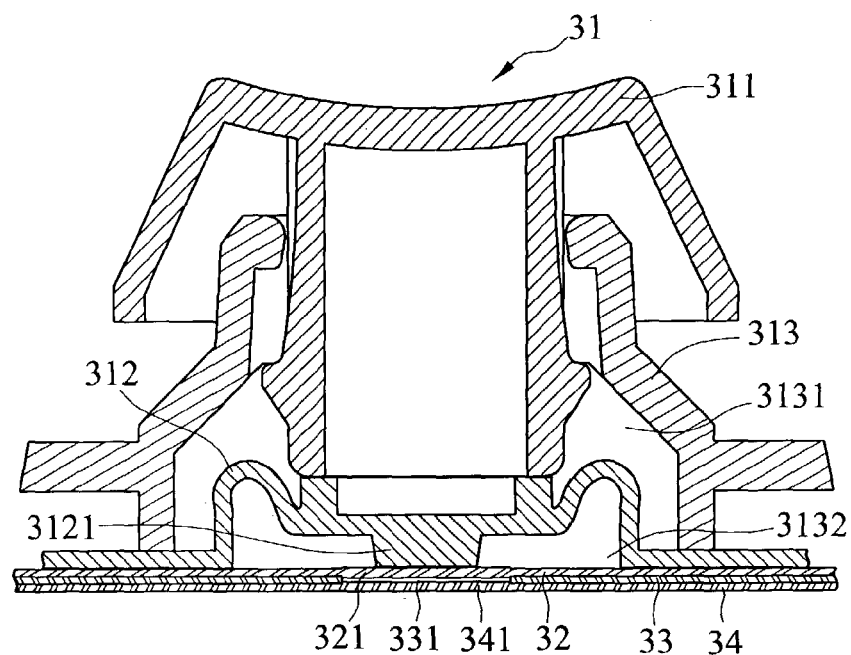
FIGS. 3A and 3B are schematic views of the button key of the invention in operation.
Figure 3B:
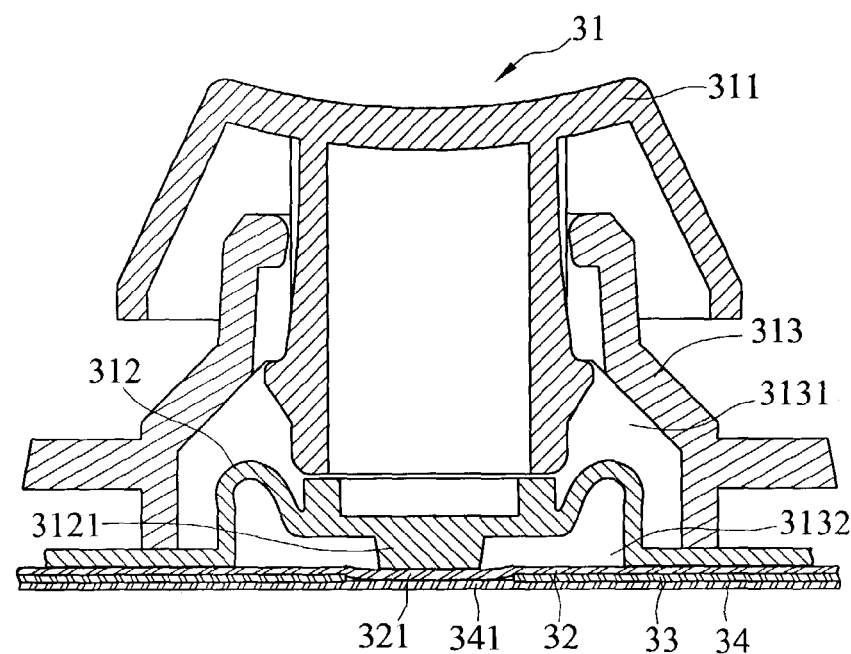

Referring to FIGS. 1 and 2, the apparatus of the invention includes a timer 10, a scanner 20 and a keyboard 30. The timer 10 is for counting time. The scanner 20 is for scanning the keyboard 30. The keyboard 30 connects electronically to the timer 10 and the scanner 20, and includes a plurality of button keys. Each button key has a button key structure 31, a first conductor membrane 32, a spacing membrane 33, and a second conductor membrane 34.

The button key structure 31 includes a key top 311, an elastic member 312 and a key seat 313. The key top 311 is for receiving the depressing of users. The elastic member 312 corresponds to the key top 311 and the first conductor membrane 32, and includes an actuating conductor 3121. The key seat 313 has an upper housing chamber 3131 and a lower housing chamber 3132. The upper housing chamber 3131 is to accommodate the key top 311 and the elastic member 312, and allow the key top 311 to move only towards the elastic member 312 when subject to external force. The lower housing chamber 3132 is to accommodate the first conductor membrane 32, the spacing membrane 33 and the second conductor membrane 34.

The first conductor membrane 32 is located below the button key structure 31 and has a first conductor 321. The first conductor 321 corresponds to the actuating conductor 3121 of the button key structure 31. The spacing membrane 33 is located below the first conductor membrane 32 and has an opening 331 corresponding to the first conductor 321. The second conductor membrane 34 is located below the spacing membrane 33 and has a second conductor 341. The second conductor 341 corresponds to the opening 331.

Referring to FIGS. 1, 2, 3A and 3B, when in use, first set the timer 10 to zero and stop counting time. Next, the scanner 20 scans the keyboard 30 to locate the button key that is being depressed by an external force. When the key top 311 of the button key structure 31 is depressed by the external force, the key top 3 11 is confined in the upper housing chamber 3131 and moved towards the elastic member 312. The elastic member 312 is deformed in the direction of the first conductor membrane 32 and drives the actuating conductor 3121 to establish electronic connection with the first conductor 321 and output a first signal (corresponding to the original output signal of the key). Depending on the force, it may happen that only the actuating conductor 3121 is connected electronically to the first conductor 321 to output the first signal, or if the force is excessively strong, in addition to the electronic connection between the actuating conductor 3121 and the first conductor 321, the first conductor membrane 32 is also deformed in the direction of the spacing membrane 33, and the first conductor 321 runs through the opening 331 to establish electronic connection with the second conductor 341. When the electronic connection between the first conductor 321 and the second conductor 341 has been established and confirmed, the timer 10 starts counting. In the event that the time counted by the timer 10 does not exceed a selected time period, the first signal is output. If the time counted exceeds the selected time period, a second signal is output (such as the signal of a composite key or another key). Thus with a different depressing force or time period users may selectively input the original signal of a button key or the signal of another key (the signal of a composite key or another key).

Figure 4:
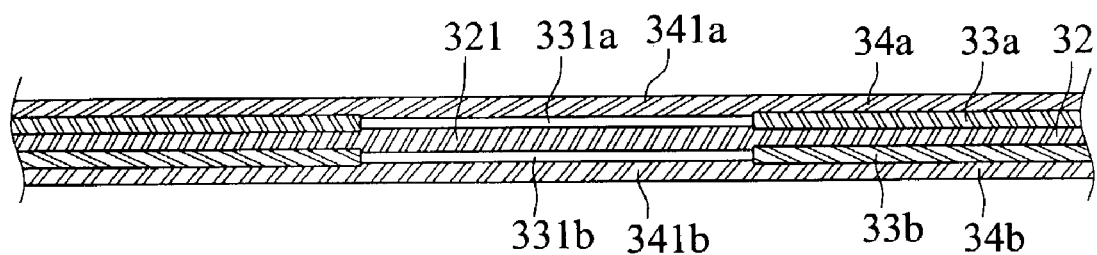
FIG. 4 is a fragmentary sectional view of another embodiment of the button key of the invention.
Figure 5A:
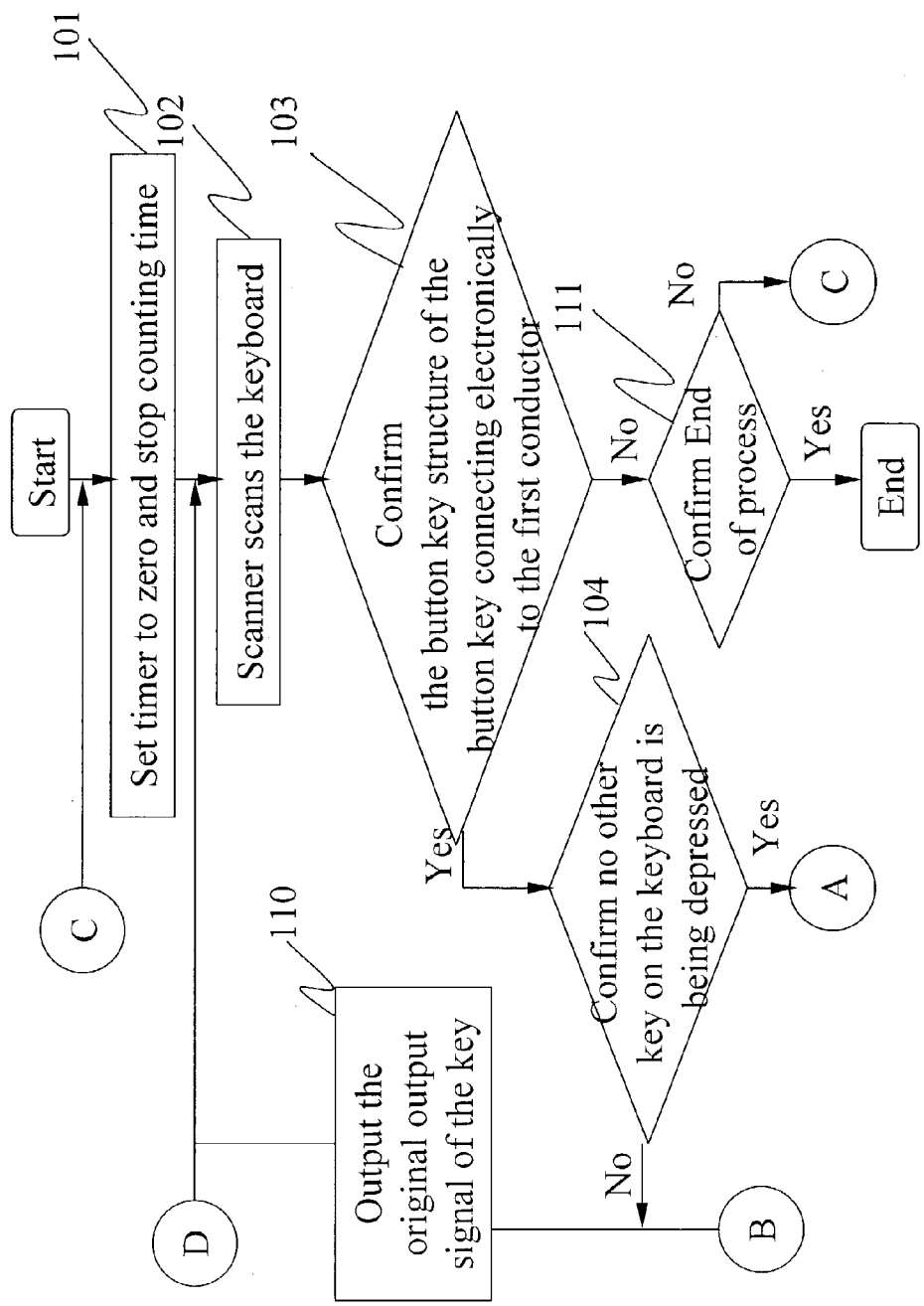
FIGS. 5A and 5B are process flow charts of the invention.
Figure 5B:
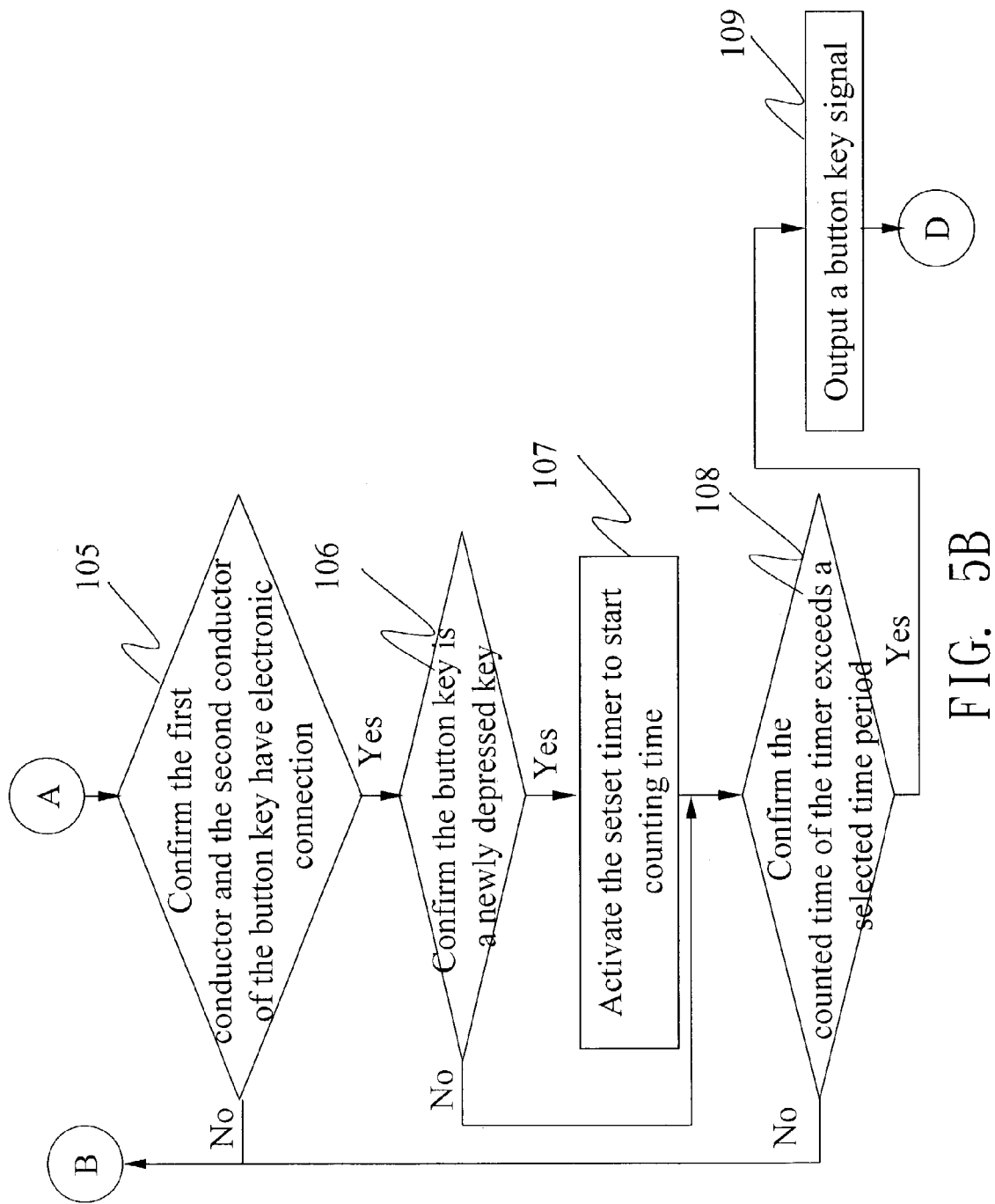

Refer to FIG. 4 for another embodiment of the button key. It includes a button key structure 31 (like the one shown in FIGS. 3A and 3B), a first conductor membrane 32, spacing membranes 33a and 33b, and second conductive membranes 34a and 34b. It mainly adds the second conductor membrane 34a and the second spacing membrane 33a above the first conductor membrane 32. When in use (also referring to FIGS. 3A, 3B and 4), first set the timer 10 to zero and stop counting time. Next, the scanner 20 scans the keyboard 30 to locate the button key that is being depressed by an external force. When the key top 311 of the button key structure 31 is depressed by an external force, the key top 311 is confined in the upper housing chamber 3131 and moved towards the elastic member 312. The elastic member 312 is deformed in the direction of the second conductor membrane 34a, drives the actuating conductor 3121 to compress the second conductor membrane 34a, and pushes the second conductor 341a to run through the opening 331a of the spacing membrane 33a to establish electronic connection with the first conductor 321 and output a first signal (corresponding to the original output signal of the key). Depending on the force, it may happen that only the second conductor 341a connects to the first conductor 321 to output the first signal, or if the force is excessive, in addition to the electronic connection between the second conductor 341a and the first conductor 321, the first conductor membrane 32 is also deformed in the direction of the spacing membrane 33b, and the first conductor 321 runs through the opening 331b to establish electronic connection with the second conductor 341b of the second conductor membrane 34b. When the electronic connection between the first conductor 321 and the second conductor 341 has been established and confirmed, the timer 10 starts counting . In the event that the time counted by the timer 10 does not exceed a selected time period, the first signal is output. If the time counted exceeds the selected time period, a second signal is output (such as the signal of a composite key or another key). Thus with a different depressing force or time period, users may selectively input the original signal of the button key or the signal of another key (such as the signal of a composite key or another key).

The method of the invention for determining output signals according to pressure and depressing time includes the following steps:

setting the timer to zero and stopping counting (step 101);

the scanner scanning the keyboard to locate the button key on the keyboard depressed by an external force (step 102);

confirming electronic connection between the button key structure of the button key and the first conductor (step 103); if the outcome is positive, proceed to the next step (step 104); if the outcome is negative, confirm whether the process is finished (step 111); if the outcome is positive, end the process; if the outcome is negative, return to step 101;

confirming whether another key on the keyboard is depressed (step 104); if the outcome is positive, proceed to the next step (step 105); if the outcome is negative, proceed with outputting the original output signal of the key (step 110), and return to step 102;

confirming whether electronic connection is established between the first conductor and the second conductor (step 105); if the outcome is positive, proceed to the next step (step 106); if the outcome is negative, output the original output signal of the key (step 110), and return to step 102;

confirming whether the button key is a key being newly depressed (step 106); if the outcome is positive, activate the set timer to start counting time (step 107); if the outcome is negative, proceed to step 108;

confirming whether the time counted by the timer exceeds a selected time period (step 108); if the outcome is positive, proceed to the next step (step 109); if the outcome is negative, output the original output signal of the key (step 110), and return to step 102;

outputting another button key signal (step 109) (a composite key signal or the signal of another key); return to step 102 and continue the process.

By means of the construction set forth above, the apparatus and method for determining output signals according to pressure and depressing time of the invention can achieve the following effects:

1. Users do not have to use composite keys for an extended period of time and can avoid hand injury.
2. The function of some button keys may be transferred to other keys, thus the configuration layout of the button keys may be shrunk and still meet the profile requirements of electronic devices. Information entry is thus more convenient.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An apparatus for determining output signals according to pressure and depressing time, comprising:

a timer;

a scanner; and a keyboard connected electronically to the timer and the scanner including a plurality of button keys each having a button key structure, a first conductor membrane, a spacing membrane and a second membrane;

wherein the first conductor membrane has a first conductor corresponding to the button key structure, the spacing membrane has an opening corresponding to the first conductor, and the second conductor membrane has a second conductor corresponding to the opening, when in use, the timer is set to zero and stops counting time, then the scanner scans the keyboard to locate the button key which is depressed by an external force, and depending on the external force, the button key structure is selectively connected electronically to the first conductor to output a first signal, and to make the button key structure to connect electronically to the first conductor, and to make the first conductor to run through the opening to connect electronically to the second conductor, and the timer starts counting time when the electronic connection between the first conductor and the second conductor has been confirmed, and the first signal is output when the external pressure is smaller than a set pressure, the first signal is output when the external pressure is larger than the set pressure and the time counted by the timer does not exceed a selected time period, and a second signal is output when the time counted by the timer exceeds the selected time period, the second signal being a composite-key signal.

2. The apparatus for determining output signals according to pressure and depressing time of claim 1, wherein the button key structure includes:

a key top; and an elastic member corresponding to the key top and the first conductor membrane, the elastic member having an actuating conductor corresponding to the first conductor so that when the key top is subject to an external force the elastic member is deformed to drive the actuating member to connect electronically to the first conductor.

3. The apparatus for determining output signals according to pressure and depressing time of claim 2, wherein the button key structure further includes:

a key seat which has an upper housing chamber and a lower housing chamber, the upper housing chamber accommodating the key top and the elastic member and allowing the key top to move only towards the elastic member when subject to the external force, the lower housing chamber accommodating the first conductor membrane, the spacing membrane and the second conductor membrane.

4. The apparatus for determining output signals according to pressure and depressing time of claim 1 further including:

an another spacing membrane which has an another opening corresponding to the first conductor; and an another second conductor membrane which has an another second conductor corresponding to the another opening and the button key structure such that when the button key structure is subject to a selected external force the another second conductor selectively running through the another opening to connect electronically to the first conductor and to output the first signal and the another second conductor running through the another opening to connect electronically to the first conductor, and the first conductor running through the opening to connect electronically to the second conductor and to output the First signal when the time counted by the timer does not exceed the selected time period, and the second signal is output when the time counted by the timer exceeds the selected time period.

5. The apparatus for determining output signals according to pressure and depressing time of claim 4, wherein the button key structure includes:

a key top; and an elastic member corresponding to the key top and the first conductor membrane, the elastic member having an actuating conductor corresponding to the first conductor so that when the key top is subject to an external force the elastic member is deformed to drive the actuating member to connect electronically to the first conductor.

6. The apparatus for determining output signals according to pressure and depressing time of claim 5, wherein the button key structure further includes:

a key seat which has an upper housing chamber and a lower housing chamber, the upper housing chamber accommodating the key top and the elastic member and allowing the key top to move only towards the elastic member when subject to the external force, the lower housing chamber accommodating the another spacing membrane, the another second conductor membrane, the first conductor membrane, the spacing membrane and the second conductor membrane.

7. A method for determining output signals according to pressure and depressing time, comprising steps of:

setting a timer to zero and stopping counting;

scanning a keyboard by a scanner to locate a button key on the keyboard depressed by an external force;

confirming electronic connection between a button key structure and a first conductor of the button key;

confirming no other button key being depressed on the keyboard, when the step of confirming no other button key being depressed on the keyboard has a negative outcome, outputting the original signal of the button key and returning to the step of setting a timer to zero and stopping counting;

confirming electronic connection between the first conductor and a second conductor of the button key;

confirming the button key being a newly depressed button key;

activating the set timer to start counting time;

confirming the time counted by the timer exceeding a selected time period, when the step of confirming the time counted by the timer exceeding the selected time period has a negative outcome, outputting the original signal of the button key and returning to the step of setting a timer to zero and stopping counting; and when the step of confirming the time counted by the timer exceeding the selected time period has a positive outcome, outputting a button key signal, the button key signal being a composite-key signal.

8. The method of claim 7, wherein when the step of confirming electronic connection between a button key structure and a First conductor of the button key has a negative outcome, proceeding the step of confirming end of processing.

9. The method of claim 7, wherein when the step of confirming electronic connection between the first conductor and a second conductor has a negative outcome, pro ceeding the step of outputting the original signal of the button key and return to the step of setting a timer to zero and stopping counting.

10. The method of claim 7, wherein when the step of confirming the button key being a newly depressed button key has a negative outcome, directly proceeding the step of confirming the time counted by the timer exceeding a selected time period.

* * * * *